United States Patent
Wang et al.

(10) Patent No.: US 7,399,521 B2
(45) Date of Patent: Jul. 15, 2008

(54) CARBON-CONTAINING METAL MATRIX COMPOSITE MATERIAL HAVING HIGH THERMAL CONDUCTIVITY AND METHOD FOR PRODUCING THE SAME

(75) Inventors: Chun-Shan Wang, Tainan Hsien (TW); Ya-Jen Huang, Tainan Hsien (TW); Chin-Tien Kuo, Tainan Hsien (TW); Yi-Chen Wu, Tainan Hsien (TW)

(73) Assignee: Yonyu Plastics Co., Ltd., Tainan (TW)

( * ) Notice: Subject to any disclaimer, the term of this patent is extended or adjusted under 35 U.S.C. 154(b) by 343 days.

(21) Appl. No.: 11/326,321

(22) Filed: Jan. 6, 2006

(65) Prior Publication Data

US 2007/0160841 A1 Jul. 12, 2007

(51) Int. Cl.
*B32B 15/04* (2006.01)

(52) U.S. Cl. .................... 428/293.1; 428/408

(58) Field of Classification Search .............. 428/293.1, 428/408; 249/84
See application file for complete search history.

(56) References Cited

U.S. PATENT DOCUMENTS 5,814,408 A * 9/1998 Ting et al. .................. 428/408

* cited by examiner

*Primary Examiner*—N Edwards
(74) *Attorney, Agent, or Firm*—Rosenberg, Klein & Lee

(57) ABSTRACT

A carbon-containing metal matrix composite material and a method for producing the same are described, wherein the graphitized vapor grown carbon fibers (VGCF) on which a metal carbide film is formed via a sintering step, so as to improve the compounding quality and increase the content of the carbon material in the metal matrix, are dispersed uniformly in the metal matrix. The graphitized VGCF used in the present invention can be unidirectional VGCF or the VGCF having a three-dimensional linkage structure.

6 Claims, 3 Drawing Sheets

CARBON-CONTAINING METAL MATRIX COMPOSITE MATERIAL HAVING HIGH THERMAL CONDUCTIVITY AND METHOD FOR PRODUCING THE SAME

FIELD OF THE INVENTION

The present invention relates to a carbon-containing metal matrix composite material having high thermal conductivity and a method for producing the carbon-containing metal matrix composite material, and more particularly, to the carbon-containing metal matrix composite material and the fabrication method thereof applicable to heat-dissipation elements by using vapor-grown carbon fibers (VGCF), especially the directly-grown VGCF having a three-dimensional (3-D) linkage structure.

BACKGROUND OF THE INVENTION

"Heat" has always been the issue for the electronic elements in operation, and heat dissipation has become the bottleneck for the development of critical technologies. Currently, with regard to the heat dissipation path of an electronic element, the heat is first transmitted to the surface of the electronic element through internal packaging material, and then is conducted to the external portion of heat source by using a larger heat spreader, wherein fins or fans are added thereon to reinforce the heat convection effect.

Recently, the material for forming heat-dissipation elements is quite a popular topic. With the development of electronic products trending towards lightness and thinness, miniaturization, high performance and high frequency, the heat generation per unit volume is increased accordingly, and thus the heat-dissipation material with higher thermal conductivity is needed. Aluminum extrusion material, such as 6063 aluminum extrusion material, is commonly used as heat-dissipation material for fabricating various heat-dissipation elements. Since the thermal-conductivity of the aluminum extrusion heat-dissipation material is not high, which is merely between 160 W/mK and 180 W/mK, it cannot meet the heat-dissipation requirements of modern electronic elements. Although various modified processes have been developed for the aluminum extrusion heat-dissipation material, such as a bonding fins process, a folding fins process, a modified die casting process, a forging process and a skiving process, etc., yet the bottleneck problem of heat dissipation still cannot be resolved.

Since the high temperature in electrical circuits will affect the operation efficiency of electronic elements, a heat-dissipation module has to be installed for keeping the temperature of the electronic elements below the critical safety temperature, thereby preventing the electronic elements from malfunction and instability caused by overheat. However, the thermal-conductivity of heat-dissipation elements is limited, thus resulting in the bottleneck problem of heat dissipation. Because the thermal-conductivity (about 380 W/mK) of copper is greater than that of aluminum, copper-base heat-dissipation material has been developed nowadays.

For improving the heat conductive efficiency of heat-dissipation elements, the conventional technologies use the addition of diamond powder or carbon powder to promote the heat conduction of composite material. For example, U.S. Pat. No. 6,264,882 disclosed a process for fabricating a composite material having high thermal conductivity and having specific application as a heat sink or heat spreader for high density integrated circuits, and the composite material produced by this process has a thermal conductivity between that of diamond and copper. This process basically consists of sputter coating a metal layer on diamond powder; then compacting them into a porous body; and then infiltrating the porous body with a suitable braze material, thereby producing a dense diamond-copper composite material with a high thermal conductivity. Another conventional technology may first mixing copper powder with carbon powder and a polymer; or mixing copper powder with a carbon-containing polymer uniformly to form a mixture, and then form a copper matrix carbon composite material by removing the polymer in the mixture via multiple high-temperature heat treatments. Still another conventional technology may form a carbon-containing composite material by first coating polyacrylonitrile (PAN) carbon fibers with asphalt, an asphalt derivative or a polymer and then carbonizing and graphitizing.

However, the diamond powder and carbon powder used in the aforementioned conventional technologies are all in particulate form. If only small amount of diamond powder or carbon powder is added in a composite material, the continuity of diamond powder or carbon powder in the composite material is not easy to accomplish, thus having difficulty in improving the heat conduction capability of the composite material. On the other hand, if a large amount of diamond powder or carbon powder is added, then properties of the composite material will be affected. Although PAN carbon fibers may have better continuity, yet the thermal-conductivity of the graphitized PAN carbon fibers is merely between 20 W/mk and 500 W/mk, so that the PAN carbon fibers has limited contribution on promoting the heat conduction capability of the composite material. Further, the conventional technologies often face the poor interfacial problem when the carbon material is compounded with a metal matrix.

SUMMARY OF THE INVENTION

Hence, there is a need to develop a carbon-containing metal matrix composite material having high thermal conductivity and a method for producing the same, thereby improving the interfacial problem between a carbon material and a metal matrix; promoting thermal conductivity of the carbon-containing metal matrix composite material by using the carbon material having high thermal conductivity and good continuity, thus further improving the heat-dissipation efficiency of the heat-dissipation element by using the carbon-containing metal matrix composite material.

In one aspect, the present invention provides a carbon-containing metal matrix composite material having high thermal conductivity and a method for producing the same, wherein VGCF with a 3-D linkage structure or unidirectional VGCF having high thermal conductivity are used as an additive carbon material, and a carbide metal film is formed on the surfaces of the VGCF, thereby improving the interfacial problem between the carbon material and a metal matrix; and promoting the compounding quality and increasing the content of the carbon material in the metal matrix, thus greatly promoting thermal-conductivity of the carbon-containing metal matrix composite material; and further using the carbon-containing metal matrix composite material to form the heat-dissipation element having excellent heat-dissipation efficiency.

According to the aforementioned aspect of the present invention, a carbon-containing metal matrix composite material and a method for producing the same are provided, and comprises graphitized VGCF with a metal carbide film formed thereon and a metal matrix, wherein the content of the graphitized VGCF with the metal carbide film is between about 1 wt % and about 40 wt %, and the content of the metal matrix is between about 60 wt % and about 99 wt %. The thermal-conductivity of the carbon-containing metal matrix composite material is between that of the metal matrix and that of the graphitized VGCF, and the thermal-conductivity of the graphitized VGCF is between about 1000 W/mK and about 1980 W/mK.

According to a preferred embodiment of the present invention, the VGCF of the aforementioned graphitized VGCF with metal carbide film can be unidirectional VGCF or directly-grown VGCF having a 3-D linkage structure, wherein the carbon content of the graphitized VGCF with metal carbide film is between about 70 wt % and about 99 wt %.

According to a preferred embodiment of the present invention, the material of a metal component existing in the metal carbide film and that of the metal matrix can be the same or different.

According to a preferred embodiment of the present invention, a metal component existing in the metal carbide film may comprise but is not limited to tungsten (W), chromium (Cr), titanium (Ti), zirconium (Zr), vanadium (V), molybdenum (Mo) or combinations thereof.

According to the aforementioned aspect of the present invention, a method for fabricating a carbon-containing metal matrix composite material having high thermal conductivity is provided. At first, graphitized VGCF with a metal carbide film formed thereon are provided, wherein the thermal-conductivity of the graphitized VGCF is between about 1000 W/mK and about 1980 W/mK. Thereafter, a compounding/molding step is used for a metal matrix and the graphitized VGCF with a metal carbide film to form the carbon-containing metal matrix composite material having high thermal conductivity, wherein the thermal-conductivity of the carbon-containing metal matrix composite material is between that of the metal matrix and the graphitized VGCF.

According to a preferred embodiment of the present invention, the step of providing the graphitized VGCF with a metal carbide film comprises the following steps. At first, VGCF are formed from a pyrolysis reaction of raw material under presence of a reducing gas (such as hydrogen) with the temperature from about 600° C. to about 1400° C., wherein the raw material comprises a hydrocarbon compound and a catalyst. Thereafter, a step is performed for graphitizing the VGCF in the presence of an inert gas with the temperature from about 2400° C. to about 3000° C. Then, a sintering step is performed for forming the metal carbide film on surfaces of the graphitized VGCF.

According to a preferred embodiment of the present invention, the aforementioned catalyst can be transition metals such as iron (Fe), nickel (Ni) and cobalt (Co), or organic compounds thereof.

According to a preferred embodiment of the present invention, the aforementioned hydrocarbon compound can be in liquid phase or gas phase, such as carbon monoxide, benzene, toluene, xylene, acetylene and liquefied petroleum gas, or mixtures thereof.

According to a preferred embodiment of the present invention, the aforementioned VGCF are directly-grown VGCF having a three-dimensional linkage structure, and the aforementioned catalyst is a heterogeneous catalyst comprising ferrocene ($Fe(C_5H_5)_2$) and a non-iron organometalic compound, wherein the content of the ferrocene in the raw material is between about 0.1 wt % and about 10 wt %, and the content of the non-iron organometalic compound in the raw material is between about 0.1 wt % and about 5 wt %.

According to a preferred embodiment of the present invention, the graphitized VGCF with a metal carbide film is formed by adding the graphitized VGCF to a metal compound solution, followed by removing solvent, pyrolysis and sintering step, wherein a metal component existing in the metal compound solution can be such as tungsten, chromium, titanium, zirconium, vanadium, molybdenum or combinations thereof; and the metal compound solution can be prepared from a metal compound such as ammonium paratungstate, tungstophosphoric acid, tungstic acid, tungsten chloride, titanium isopropoxide, chromocene, ammonium chromate, chromium chloride, chromium acetylacetonate, chromium acetate, chromium nitrate nonahydrate, ammonium paramolybdate, zirconium chloride, zirconium acetylacetonate, zirconium t-butoxide, vanadyl acetylacetonate, or combinations thereof.

According to a preferred embodiment of the present invention, the compounding/molding step is performed by using a melting method, a squeeze casting method, a melt casting method, a metal-powder compact pressing method or a metal injection molding (MIM) method for forming the carbon-containing metal matrix composite material with high thermal conductivity.

According to a preferred embodiment of the present invention, while the compounding/molding step is performed, an organic binder is added to the mixture of the metal matrix and the graphitized VGCF with a metal carbide film, wherein the content of the organic binder in the total amount of the metal matrix and the graphitized VGCF with a metal carbide film is substantially between 0.1 wt % and 10 wt %.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention is featured in first fabricating unidirectional graphitized-VGCF or graphitized-VGCF having a 3-D linkage structure, both having high thermal conductivity; then forming a metal carbide film on the graphitized VGCF for improving the interface property between the carbon fibers and a metal matrix, thereby promoting the compounding quality and increasing the content of the carbon material in the metal matrix; and thereafter compounding/molding the metal matrix with the graphitized VGCF with a metal carbide film formed thereon, thereby obtaining a carbon-containing metal matrix composite material with high thermal conductivity. The carbon-containing metal matrix composite material is further used to fabricate heat-dissipation elements having excellent heat-dissipation efficiency. Hereinafter, a carbon-containing metal matrix composite material and a method for producing the same according to the present invention will be explained in detail with reference to FIG. 1 to FIG. 4.

Figure 1:
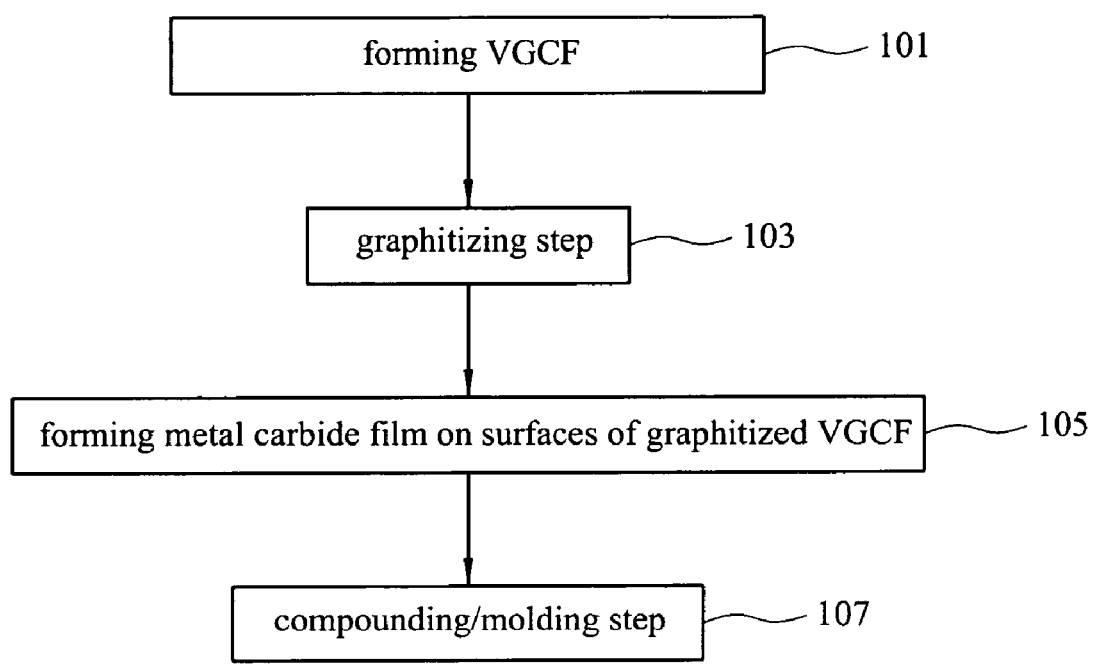
FIG. 1 is a schematic flow chart showing the method for producing a carbon-containing metal matrix composite material according to a preferred embodiment of the present invention.

Referring FIG. 1, FIG. 1 is a schematic flow chart showing the method for producing a carbon-containing metal matrix composite material according to a preferred embodiment of the present invention. At first, step 101 is performed in a tubular reactor made of such as aluminum oxide, silicon carbide, quartz, mullite or silicon nitride, etc., for forming VGCF from a pyrolysis reaction of a raw material under presence of a reducing gas with the temperature substantially from 600° C. to 1400° C., wherein the raw material comprises a hydrocarbon compound (carbon source) and a catalyst, and the hydrocarbon compound is used to form VGCF via the catalyst. The aforementioned reducing gas is generally hydrogen gas, and the catalyst is generally a transition metal or an organic compounds thereof, and preferably iron (Fe), nickel (Ni), cobalt (Co) or an organic compound thereof. The hydrocarbon compound (carbon source) is generally a liquid or gaseous hydrocarbon compound, and preferably carbon monoxide, benzene, toluene, xylene, acetylene, liquefied petroleum gas or a mixture thereof.

It is worthy to be noted that the VGCF applied in the present invention can be unidirectional VGCF or directly-grown VGCF having a 3-D linkage structure. For directly growing the VGCF having the 3-D linkage structure, the catalyst is a heterogeneous catalyst comprising ferrocene ($Fe(C_5H_5)_2$) and a non-iron organometalic compound, wherein the content of the ferrocene in the aforementioned raw material is substantially between 0.1 wt % and 10 wt %, and the content of the non-iron organometalic compound in the raw material is substantially between 0.1 wt % and 5 wt %. The hydrocarbon compound used for directly forming the VGCF having the 3-D linkage structure can be an aliphatic hydrocarbon compound, an aromatic hydrocarbon compound or combinations thereof, wherein the aliphatic hydrocarbon can be such as methane, ethylene, styrene, acetylene, propane, liquefied petroleum gas, butane, butene, butadiene, or a combination thereof, and the aromatic hydrocarbons can be such as benzene, toluene, xylene, styrene or a combination thereof. The non-iron organometalic compound can be an organic aluminum (Al) compound, an organic stannum (Sn) compound, an organic chromium (Cr) compound, an organic titanium (Ti) compound, an organic zirconium (Zr) compound, an organic tungsten (W) compound, an organic vanadium (V) compound, an organic molybdenum (Mo) compound and a combination thereof, wherein the organic aluminum compound can be such as aluminum isopropoxide; the organic stannum compound can be such as stannic tert-butoxide; the organic titanium compound can be such as titanium isopropoxide or titanium tetrabutoxide; the organic zirconium compound can be such as zirconium acetylacetonate; the organic chromium (Cr) compound can be such as chromocene; and the organic vanadium compound can be such as vanadyl acetylacetonate. Further, the raw material used for directly forming the VGCF having the 3-D linkage structure comprises thiophene, wherein the content of thiophene in the raw material is between about 0.1 wt % and about 5 wt %.

Thereafter, graphitizing step 103 is performed by placing the aforementioned VGCF in such as a graphitization oven under presence of an inert gas with the temperature from about 2400° C. to about 3000° C., wherein the inert gas can be such as helium, argon, neon and krypton. The graphitizing step 103 can be processed in accordance with the conventional process parameters, and is not stated in detail herein. After the graphitizing step 103, the thermal-conductivity of the graphitized VGCF is increased to the value between about 1000 W/mK and about 1980 W/mK, and the graphitized VGCF are slender and hollow, such as a graphite winding structure. The respective diameters of the graphitized VGCF are between about 0.01 μm and about 10 μm, and the respective lengths of the graphitized VGCF are between about 1 μm and about 10 cm, and the respective aspect ratios of the graphitized VGCF are between about 100 and about 10000. If the aspect ratios of the graphitized VGCF are too small, it is not easy to form a continuous path; if the aspect ratios of the graphitized VGCF are too large, the graphitized VGCF are likely to be entangled, thus causing poor dispersion. Hence, according to the present invention, the respective diameters of the graphitized VGCF are preferably between about 0.1 μm and about 1 μm, and the respective length of thereof are between about 50 μm and about 2 mm, and the respective aspect ratios of thereof are between about 500 and about 2000.

Generally speaking, the problem of poor interface often occurs when the conventional carbon material is compounded with a metal matrix. Hence, after the graphitizing step 103, step 105 is performed for forming a metal carbide film on the surfaces of the graphitized VGCF for improving the poor interface between the conventional carbon material and the metal matrix. In the step 105, the graphitized VGCF are first added to a metal compound solution; then a solvent in the metal compound solution is vaporized and removed under agitation, and thus a metal compound film is uniformly formed on the surfaces of the graphitized VGCF; and thereafter a sintering step is preformed for converting the metal compound film to the metal carbide film bonded to the carbon fibers. The solvent referred herein is well known to those who are skilled in the art, and can be such as water or an organic solvent, and thus will not be stated in detail herein. The metal component existing in the aforementioned metal compound solution is a metal that can form a carbide easily, such as (but not limited) to tungsten (W), chromium (Cr), titanium (Ti), zirconium (Zr), vanadium (V), molybdenum (Mo), a combination thereof. Further, the metal compound solution is formed from a metal compound such as ammonium paratungstate, tungstophosphoric acid, tungstic acid, tungsten chloride, titanium isopropoxide, chromocene, ammonium chromate, chromium chloride, chromium acetylacetonate, chromium acetate, chromium nitrate nonahydrate, ammonium paramolybdate, zirconium chloride, zirconium acetylacetonate, zirconium t-butoxide, vanadyl acetylacetonate, or a combination thereof. However, the present invention is not limited to the metal compounds listed above, and those who are skilled in the art all know that any metal compound that can form carbide easily is suitable for use in the present invention.

The aforementioned sintering step is performed by raising the temperature in such as a heat treatment oven under presence of said inert gas or said reducing gas, whereby the metal compound film is decomposed to remove the components other than the metal component, and the remaining metal component and the graphitized VGCF are sintered so as to form a strong metal carbide film, wherein the sintering temperature and time are based on the metal components used therein. For example, when the metal component is chromium, the sintering step is performed under 1500° C. for three hours.

If the carbon content of the graphitized VGCF with metal carbide film is lower than 70 wt %, the excessive content of metal carbide layer will affect the thermal conductivity of the composite material; if the carbon content of the graphitized VGCF with metal carbide film is higher than 99 wt %, the content of metal carbide layer is too small to improve the poor interface problem of the carbon material residing in the metal matrix noticeably. Thus, the carbon content of the graphitized VGCF with the metal carbide layer formed thereon is between about 70 wt % and about 99 wt %, and preferably between about 80 wt % and about 90 wt %. In the subsequent processing steps, the graphitized VGCF with the metal carbide layer formed thereon of the present invention can improve the poor interface problem of the carbon material residing in the metal matrix noticeably.

Thereafter, compounding/molding step 107 is performed for compounding metal matrix and the graphitized VGCF with metal carbide film in a predetermined equipment via various methods for forming a carbon-containing metal matrix composite material. In an example of the present invention, a melting method, a squeeze casting method or a melt casting method can be used to form the carbon-containing metal matrix composite material with high thermal-conductivity, or a thermal-dissipation element made of the carbon-containing metal matrix composite material. At first, the metal matrix is heated and melted in a melting stove, and then mixed uniformly with the graphitized VGCF having the metal carbide layer formed thereon to form the composite material, wherein the content of the metal matrix is between about 60 wt % and about 99 wt %, and the content of the graphitized VGCF with the metal carbide film is between about 1 wt % and about 40 wt %. The material forming the metal matrix is preferably a metal having relatively high thermal-conductivity, such as copper (Cu), aluminum (Al), silver (Ag), gold (Au) or a combination thereof. Further, with respect to the respective metals forming the metal matrix and the metal carbide layer, both can be substantially the same or different, and the present invention is not limited thereto. The aforementioned composite material can be directly taken out of the melting stove and be compressed in a molding tool for forming the carbon-containing metal matrix composite material or the heat-dissipation element of the desired shape. Alternatively, the aforementioned composite material is first formed into an ingot, and then the ingot is melted and placed into the molding tool for forming the carbon-containing metal matrix composite material or the heat-dissipation element of the desired shape.

In the other example of the present invention, a metal-powder compact pressing method or a metal injection molding (MIM) method is used, in accordance with the complexity of product, to form the carbon-containing metal matrix composite material with high thermal conductivity, or a thermal-dissipation element made of the carbon-containing metal matrix composite material. At first, metal matrix powder and the graphitized VGCF having the metal carbide layer formed thereon are uniformly mixed to form a mixture, wherein the content of the metal matrix powder is between about 60 wt % and about 99 wt %, and the content of the graphitized VGCF with the metal carbide film is between about 1 wt % and about 40 wt %. Further, an organic binder can be added to the mixture for assisting composite molding, wherein the content of the organic binder in the mixture is between about 0.1 wt % and about 10 wt %. The suitable organic binder can be but not limited to stearic acid, zinc stearate, lithium stearate, microcrystallic wax, paraffin wax, paraffin oil, rubber, plastic, or a combination thereof. After the aforementioned components are uniformly mixed, the mixture thus formed is placed and directly compressed in the molding tool to form a compact for forming the carbon-containing metal matrix composite material or the heat-dissipation element of the desired shape. Alternatively, the mixture thus formed is kneaded and pelletized to form a feedstock, and the feedstock is injected into the molding tool via an injection molding machine so to form the compact.

After the compact is formed, a de-binding step is performed for removing the organic binder contained in the compact, such as heating to 600° C. and maintaining 600° C. for about one hour. Thereafter, a sintering step is performed, for example, place the de-binded compact into a sintering oven under 1000° C. for about one hour, thereby enabling the metal particles to be combined and densified as a porous body. Thereafter, an infiltrating step is performed for some molten metal matrix that is the same as or different from the aforementioned metal matrix to fill in the pores of the porous body, thereby forming the carbon-containing metal matrix composite material or a thermal-dissipation element thereof.

It is noted that the thermal-conductivity of the carbon-containing metal matrix composite material or the thermal-dissipation element is between that of the metal matrix and that of the graphitized VGCF. When the material of the metal matrix is copper, the thermal-conductivity of the carbon-containing metal matrix composite material formed is between about 400 W/mK and 1000 W/mK.

Hereinafter, several examples are stated for further explaining the present invention, but are not to be used to limit the scope of the present invention.

ENABLEMENT EXAMPLE 1A

Figure 2:
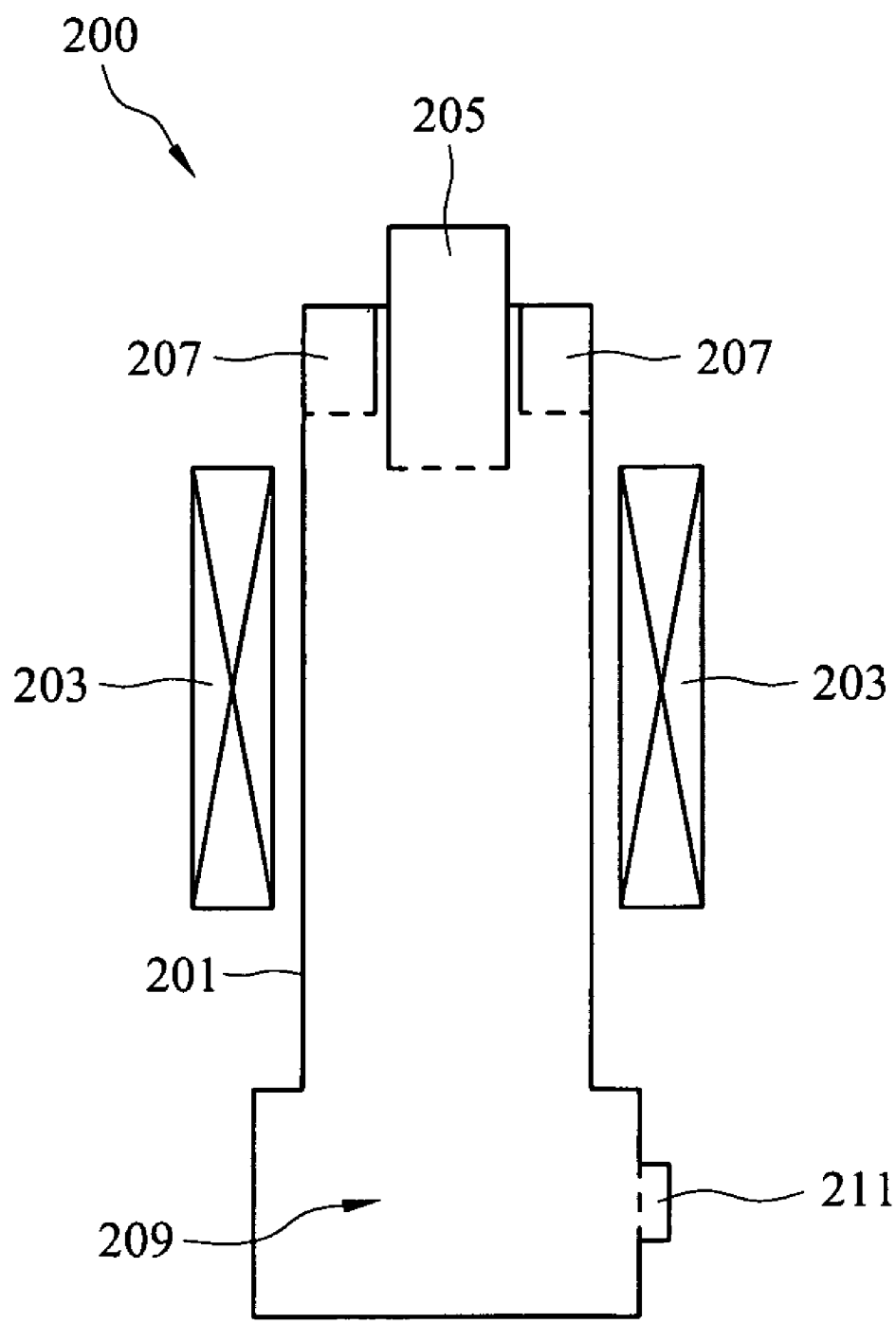
FIG. 2 is a schematic diagram showing a VGCF reaction apparatus adopted for explaining the preferred embodiment of the present invention.

Referring to FIG. 2, FIG. 2 is a schematic diagram showing a VGCF reaction apparatus adopted for explaining the preferred embodiment of the present invention. A reaction tube apparatus 200 is a fluidized-bed type apparatus, such as an upright aluminum oxide tube. The reaction tube apparatus 200 generally includes a tubular reactor 201 and a heater 203 located outside the tubular reactor 201. There are a material guide tube 205 and a carrier gas inlet 207 are located on one end of the tubular reactor 201, and a collection bin 209 is located on the other end of the tubular reactor 201. The tubular reactor 201 is made of such as aluminum oxide, silicon carbide, quartz, mullite or silicon nitride, etc. In this example, the tubular reactor 201 is made of such as aluminum oxide of 99.8% purity, and the outer diameter thereof is 76.2 cm, and the inner diameter thereof is 69.8 cm, and the length thereof is 150 cm. During the process for producing the VGCF, air inside the tubular reactor 201 is replaced by nitrogen gas, and then the tubular reactor 201 is heated by the heater 203 and is kept at about 1100° C. Thereafter, the supply of nitrogen gas is stopped, and alternatively, hydrogen gas is introduced into the tubular reactor 201 at the flow rate of 10 L/min so as to form reducing gas atmosphere in the tubular reactor 201. Then, the xylene solution containing 4 wt % of ferrocene is delivered continuously into the tubular reactor 201 ate the flow rate of 8 mL/min, and then a pyrolysis reaction catalyzed by ferrocene occurs under high temperature, thereby forming the VGCF which fall into the collection bin 209.

Figure 3:
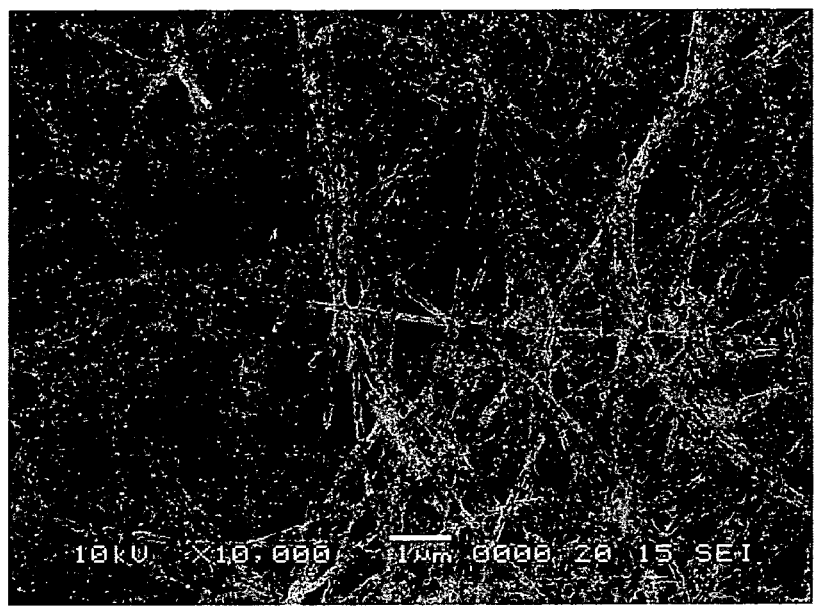
FIG. 3 shows a SEM diagram (10000×) the structure of the VGCF applied in the preferred embodiment of the present invention.

Referring to FIG. 3, FIG. 3 shows a SEM diagram (10000×) the structure of the VGCF applied in the preferred embodiment of the present invention. Such as shown in FIG. 3, the diameter of the VGCF obtained in this example is between 0.01 μm and 0.3 μm, and the length thereof is between 60 μm and 1 mm.

Thereafter, the VGCF are placed into a graphitization oven under argon atmosphere, and the graphitization oven is heated to 2800° C. at the temperature-rising rate of 10° C./min and the temperature of 2800° C. is maintained for one hour, thereby graphitizing the VGCF, wherein the thermal-conductivity of the graphitized VGCF is 1850 W/mK.

Then, the graphitized VGCF is added into a chromium acetate solution, wherein the chromium content of the chromium acetate solution is 11 wt %, and the weight ratio of the graphitized VGCF to the chromium acetate solution is 1:1. Thereafter, the chromium acetate solution containing the graphitized VGCF is placed in a rotary evaporator, and is rotated and heated for two hours under 120° C. so as to remove the water content thereof, thus allowing a chromium acetate film to remain on the surfaces of the graphitized VGCF. Then, the graphitized VGCF with the chromium acetate film formed thereon are placed in a high-temperature heat treatment oven for sintering under 1500° C. for three hours, thereby obtaining the graphitized VGCF with the strong chromium carbide film formed on the surfaces thereof, wherein the carbon content thereof is 90 wt %.

ENABLEMENT EXAMPLE 1B

The processing steps of the enablement example 1B are similar to those of the enablement example 1A except the xylene solution containing 4 wt % of ferrocene used in the enablement example 1A. Instead, the xylene solution containing 2 wt % of ferrocene and 2 wt % of aluminum isopropoxide is used in the enablement example 1B.

Figure 4:
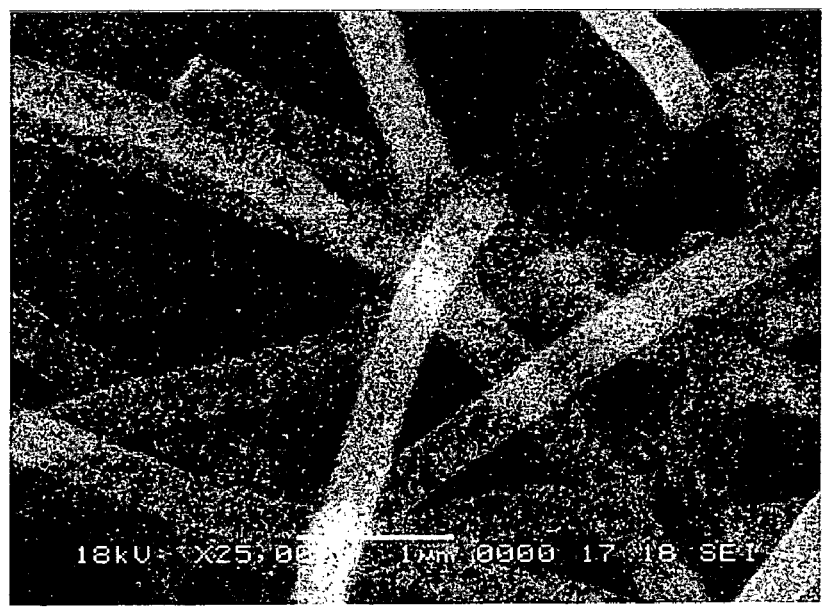
FIG. 4 shows a SEM diagram (25000×) the structure of the VGCF having a 3-D linkage structure applied alternatively in the preferred embodiment of the present invention.

Referring to FIG. 4, FIG. 4 shows a SEM diagram (25000×) the structure of the VGCF having a 3-D linkage structure applied alternatively in the preferred embodiment of the present invention. Such as shown in FIG. 4, the diameter of the VGCF having the 3-D linkage structure obtained in this example is between 0.1 µm and 0.5 µm, and the length thereof is between 60 µm and 1 mm.

Thereafter, the VGCF are placed into a graphitization oven under argon atmosphere, and the graphitization oven is heated to 2800° C. at the temperature-rising rate of 10° C./min and the temperature of 2800° C. is maintained for one hour, thereby graphitizing the VGCF having the 3-D linkage structure, wherein the thermal-conductivity of the graphitized VGCF is 1900 W/mK.

Then, the graphitized VGCF having the 3-D linkage structure undergo the subsequent processing steps similar to those of the enablement example 1A, thereby obtaining the graphitized VGCF with the strong chromium carbide film formed on the surfaces thereof, wherein the carbon content thereof is 90 wt %.

ENABLEMENT EXAMPLE 2A

At first, 10 g of the VGCF with the chromium carbide film obtained from the enablement example 1A; 90 g of copper powder having an averaged particle diameter of 20 µm; and 0.5 g of stearic acid are taken and uniformly mixed as a mixture via a mixer. Then, a compression molding machine is used to compress 15 g of the mixture by the pressure of 2000 kg/cm$^2$, so as to obtain a plate compact of the copper matrix composite material containing carbon. Thereafter, under the atmosphere of the 9:1 volume ratio of nitrogen to hydrogen, a de-binding step is performed for removing the stearic acid contained in the compact for 0.5 hour with the temperature of 400° C., and then the de-binded compact is sintered for one hour under the temperature of 1050° C., thereby obtaining a porous body.

After the porous body is cooled down, it is placed in a predetermined molding tool, and a thin layer of silver power is paved on both the top and bottom surfaces of the porous body. Then, While the porous body is compressed by the top and bottom molding plates in a heat treatment oven, an infiltrating step is performed for 0.5 hour with the temperature of 980° C. under the atmosphere of the 9:1 volume ratio of nitrogen to hydrogen, thereby infiltrating the molten silver powder into the pores of the porous body, thus forming the carbon-containing metal matrix composite material or a thermal-dissipation element thereof, wherein the thermal-conductivity of the thermal-dissipation element is 602 W/mk as measured by a NETZSCH LFA 447 laser flash instrument, and is between the thermal-conductivity of copper/silver and that of the graphitized VGCF.

ENABLEMENT EXAMPLE 2B

At first, 10 g of the VGCF having the 3-D linkage structure with the chromium carbide film obtained from the enablement example 1B; 90 g of copper powder having an averaged particle diameter of 20 µm; and 0.5 g of stearic acid are taken and uniformly mixed as a mixture via a mixer. Subsequently, the processing steps similar to those disclosed in the enablement example 2A are performed forming the metal matrix composite material containing the VGCF having the 3-D linkage structure or a thermal-dissipation element thereof, wherein the thermal-conductivity of the thermal-dissipation element is 668 W/mk as measured by a NETZSCH LFA 447 laser flash instrument, and is between the thermal-conductivity of copper/silver and that of the graphitized VGCF having the 3-D linkage structure.

ENABLEMENT EXAMPLE 3A 300 g of the VGCF with the chromium carbide film obtained from the enablement example 1A; and 700 g of aluminum ingot are heated and melted in a vacuum melting stove under agitation, and then cooled to form a bar ingot, wherein the thermal-conductivity of the bar ingot is 556 W/mK. Thereafter, the bar ingot can be melted and compressed to form the heat-dissipation element of the desired shape.

ENABLEMENT EXAMPLE 3B 300 g of the VGCF having the 3-D linkage structure with the chromium carbide film obtained from the enablement example 1B; and 700 g of aluminum ingot are heated and melted in a vacuum melting stove under agitation, and then a bar ingot is formed, wherein the thermal-conductivity of the bar ingot is 583 W/mK. Thereafter, the bar ingot can be melted and compressed to form the heat-dissipation element of the desired shape.

COMPARISON EXAMPLE 10 g of the VGCF without a metal carbide film formed thereon; 90 g of copper powder having an averaged particle diameter of 20 µm; and 0.5 g of stearic acid are taken and uniformly mixed as a mixture via a mixer. Then, a processing step similar to that of the enablement example 2A or 2B is used to compress 15 g of the mixture so as to obtain a compact of the copper matrix composite material containing carbon. However, the compact is poorly formed and easily peeled off. Alternatively, 5 g of the VGCF without a metal carbide film formed thereon; 95 g of copper powder having an averaged particle diameter of 20 µm; and 0.5 g of stearic acid are taken and uniformly mixed as a mixture via a mixer. Then, a processing step similar to that of the enablement example 2A or 2B is used to compress 15 g of the mixture so as to obtain a thermal-dissipation element made of the copper matrix composite material containing carbon, wherein the thermal-conductivity thereof is merely 380 W/mK.

Therefore, it can be known from the above examples and embodiment that the addition of the graphitized VCGF have high thermal conductivity, and the surfaces thereof have a metal carbide film for promoting the compounding quality and increasing the content of the carbon material in the metal matrix, thus greatly promoting thermal conductivity of the carbon-containing metal matrix composite material; and further using the carbon-containing metal matrix composite material to form the heat-dissipation element having excellent heat-dissipation efficiency.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A carbon-containing metal matrix composite material, comprising: graphitized vapor-grown carbon fibers (VGCF) with a metal carbide film formed thereon, wherein the content of said graphitized VGCF with said metal carbide film is substantially between 1 wt % and 40 wt %, and the thermal-conductivity of said graphitized VGCF is substantially between 1000 W/mK and 1980 W/mK; and a metal matrix, wherein said graphitized VGCF are uniformly dispersed in said metal matrix, and the content of said metal matrix is substantially between 60 wt % and 99 wt %; wherein the thermal-conductivity of said carbon-containing metal matrix composite material is between that of metal matrix and graphitized VGCF.

2. The carbon-containing metal matrix composite material of claim 1, wherein the diameters of said graphitized VGCF are substantially between 0.01 μm and 10 μm, and the lengths of said graphitized VGCF are substantially between 1 μm and 10 cm.

3. The carbon-containing metal matrix composite material of claim 1, wherein the carbon content of said graphitized VGCF with said metal carbide film is substantially between 70 wt % and 99 wt %.

4. The carbon-containing metal matrix composite material of claim 1, wherein a metal component existing in said metal carbide film is selected from the group consisting of tungsten (W), chromium (Cr), titanium (Ti), zirconium (Zr), vanadium (V), molybdenum (Mo) and combinations thereof.

5. The carbon-containing metal matrix composite material of claim 1, wherein the material forming said metal matrix is selected from the group consisting of copper (Cu), aluminum (Al), silver (Ag), gold (Au) and combinations thereof.

6. The carbon-containing metal matrix composite material of claim 1, wherein said graphitized VGCF are formed by graphitizing directly-grown VGCF having a three-dimensional linkage structure, and said directly-grown VGCF having said three-dimensional linkage structure are formed from a pyrolysis reaction of a raw material under presence of hydrogen gas, said raw material comprising a hydrocarbon compound and a heterogeneous catalyst, said heterogeneous catalyst comprising ferrocene (Fe(C.sub.5H.sub.5).sub.2) and a non-iron organometalic compound; wherein the content of said ferrocene in said raw material is substantially between 0.1 wt % and 10 wt %, and the content of said non-iron organometalic compound in said raw material is substantially between 0.1 wt % and 5 wt %.

\* \* \* \* \*